United States Patent [19]
Jablonski

[11] Patent Number: 6,143,356
[45] Date of Patent: Nov. 7, 2000

[54] DIFFUSION BARRIER AND ADHESIVE FOR PARMOD™ APPLICATION TO RIGID PRINTED WIRING BOARDS

[75] Inventor: Gregory A. Jablonski, Yardley, Pa.

[73] Assignee: Parelec, Inc., Rocky Hill, N.J.

[21] Appl. No.: 09/369,806

[22] Filed: Aug. 6, 1999

[51] Int. Cl.[7] .................................. B05D 5/12; B05D 3/02
[52] U.S. Cl. ........................... 427/96; 427/123; 427/125; 427/146; 427/191; 427/229; 427/301; 427/407.1
[58] Field of Search .............................. 427/96, 123, 125, 427/191, 229, 301, 407.1, 146

[56] References Cited

U.S. PATENT DOCUMENTS

| | | | |
|---|---|---|---|
| 4,808,274 | 2/1989 | Nguygen | 204/15 |
| 5,156,710 | 10/1992 | Chen et al. | 156/273.3 |
| 5,741,598 | 4/1998 | Shiotani et al. | 428/458 |
| 5,882,722 | 3/1999 | Kydd | 427/123 |

FOREIGN PATENT DOCUMENTS

| | | |
|---|---|---|
| 298668 | 11/1989 | European Pat. Off. . |
| WO 98/37133 | 8/1998 | WIPO . |

*Primary Examiner*—Brian K. Talbot
*Attorney, Agent, or Firm*—Woodbridge & Associates, P.C.; Stuart H. Nissim; Richard C. Woodbridge

[57] ABSTRACT

PARMOD™ materials comprised of a metal powder or metal powder mixture of specified characteristics and a Reactive Organic Medium, are easily printed or deposited on electronic components, such as a Printed Wiring Board substrate, and cured at low temperatures to form a highly conductive, well bonded, well consolidated pure metal component. The adhesion of PARMOD™ conductors on an electronic component is enhanced by printing the PARMOD™ on a polyimide coating which has been applied to the electronic component.

11 Claims, No Drawings

DIFFUSION BARRIER AND ADHESIVE FOR PARMOD™ APPLICATION TO RIGID PRINTED WIRING BOARDS

FIELD OF THE INVENTION

The present invention provides low-temperature substrates with well adhered traces of—high electrical conductivity, particularly, applying PARMOD™ compositions to temperature-sensitive substrates such as epoxy-glass and polyimide-glass laminates which have been coated with a diffusion barrier and adhesive.

BACKGROUND OF THE INVENTION

PARMOD™ technology involves the use of novel PARMOD™ compositions which can be easily printed or deposited on electronic components and cured at low temperatures to form a highly conductive, well bonded, well consolidated pure metal component. Using PARMOD™ technology, the hazardous waste production characteristic of conventional photolithography, plating and etching processes is completely eliminated. Basic PARMOD™ technology has been disclosed in U.S. Pat. No. 5,882,722 issued on Mar. 16, 1999 to Paul Kydd et al., and PCT Application WO 98/37133, "Low Temperature Method And Compositions For Producing Electrical Conductors" of Paul Kydd, et al., published on Aug. 27, 1998. The essential constituents of PARMOD™ compositions are 1) a metal powder or metal powder mixture of specified characteristics and 2) a Reactive Organic Medium (ROM) in which the consolidation of the metal powder mixture to a solid conductor takes place.

The metal powder mixture may comprise a mixture of at least two types of metal powders including: metal flakes; metal powders; and colloidal or semi-colloidal metal powders. The ROM can consist of any metallo-organic compound which is readily decomposable to the corresponding metal at a temperature below 400° C., or an organic compound which can react with the metal to produce such a compound. Examples include metal soaps and the corresponding fatty acids, metal amines and metal mercapto compounds and their corresponding amino and sulfide precursors.

The constituents of these compositions are weighed out in appropriate proportions, mixed with additional surfactants or viscosity modifiers, if needed to provide the proper consistency, and milled together, for example, on a three roll mill, to provide a homogeneous, printable composition.

The PARMOD™ composition is applied to the electronic component using any convenient technology. Screen printing and stenciling are suitable for rigid substrates in relatively small numbers with high resolution. Gravure printing, impression printing and offset printing are suitable for high production rates on flexible substrates. Ink jet printing and electrostatic printing offer the additional advantage of direct computer control of the printed image. This permits circuits to be printed directly from Computer Aided Design (CAD) files and eliminates the need for special tooling; thus, each circuit can be different, if desired, for coding or prototyping. The same end can be achieved at lower production rates with computer-controlled dispensing equipment. This equipment produces dots or lines by moving a needle over the surface and dispensing printing composition supplied by a pump or pressurized syringe.

The PARMOD™ compositions are then cured by exposure to heat for a short period of time. This time varies with the temperature to which the substrate can safely be exposed, but is less than a minute to achieve most of the electrical conductivity of which the composition is capable; in some cases the PARMOD™ composition is cured in less than 10 seconds at temperature.

Silver and gold may be cured in air. Copper and other non-noble metals require a protective atmosphere. Nitrogen with less than about 3 parts per million of oxygen has been found suitable for processing copper compositions. Addition of water vapor during the curing process, but not before or after, has been found to be beneficial in curing copper compositions.

A typical class of electronic components for which the PARMOD™ process is particularly useful are substrates for electronic circuitry. Substrates to which these compositions can be applied include rigid, glass-reinforced epoxy laminates, polyimide films for flexible circuits, other polymer-based electronic components, metal pads and semiconductor components.

Adhesion of PARMOD™ compositions to metals generally requires a clean metal surface, similar to the requirements for soldering. Acid constituents in the ROM act as fluxes to promote adhesion. Plating or tinning the metal pads is also effective. The use of organic solder protectants on copper pads is effective. Adhesion to semiconductors requires metallization with which the compositions are compatible.

As the variety PARMOD™ compositions has expanded to encompass different metals, different ROMs, and different substrates it has become evident that certain combinations of PARMOD™ and substrate result in decreased adhesion of the PARMOD™ to the substrate and lower conductivity of the cured PARMOD™ conductor. For example, copper PARMOD™ does not cure properly on epoxy surfaces even though the minimum cure temperature of 260° C. is within the capability of FR-4. The epoxy appears to exert some deleterious effect on the curing PARMOD™ mixture.

It is an object of this invention to provide an adhesive barrier coating on commonly used printed wiring board substrates which will allow PARMOD™ images to cure properly and bond securely to the substrate.

SUMMARY OF THE INVENTION

PARMOD™ mixtures can be applied to several high temperature substrates, in particular to coated DuPont Kapton polyimide film. The extension of the PARMOD™ process to lower temperatures has resulted in the potential application of PARMOD™ inks to rigid printed wiring boards, such as low temperature epoxy-glass or polyimide-glass laminates. Poor adhesion of some PARMOD™ to such materials, as well as poor electrical properties of the resulting circuits apparently caused by a chemical interaction with the substrate is a hindrance to the development of this technology.

Adhesion of the PARMOD™ to the substrate appears to depend, in part, on the softening of the polymer surface to create a physical bond in addition to any chemical bonding that takes place. The glass transition temperature of epoxy and polyimide are high enough that by themselves they do not provide proper surfaces conditions for the adhesion of PARMOD™ at its curing temperature.

The present invention improves upon the adhesion and conductivity of the PARMOD™ compositions on numerous substrates. In the novel process of the present invention the electronic component, e.g., circuit board/substrate, is coated with an adhesive diffusion barrier before application of the PARMOD™. For example, a soluble polyimide precursor has been applied as a thin coating to both epoxy-glass and polyimide-glass laminates. The polyimide coating provides a favorable surface on which to deposit the PARMOD™ by improving adhesion and not interfering with the PARMOD™ curing process. In addition to enhancing adhesion, the electrical properties on coated epoxy-glass substrates are improved dramatically compared to uncoated epoxy-glass.

DETAILED DESCRIPTION OF THE INVENTION

PARMOD™ compositions are comprised of a metal powder mixture and a Reactive Organic Medium (ROM). These compositions can be applied to temperature-sensitive substrates and cured to well-consolidated, well-bonded circuit traces by beat treatment at a temperature which does not damage the substrate. PARMOD™ compositions exhibit a critical temperature above which they undergo a transformation to well-consolidated electrical conductors with a resistivity only two or three times the bulk resistivity of the metal in question. The electrical conductivity is equal to that obtained by conventional high temperature metal powder sintering in conventional thick film compositions on ceramic substrates. Remarkably, this consolidation process takes place at temperatures 400 to 500 degrees Celsius lower than those conventionally used in thick film technology, and in times which are an order of magnitude shorter than are required for sintering.

Suitable metals include copper, silver, gold, zinc, cadmium, palladium, iridium, ruthenium, osmium, rhodium, platinum, iron, cobalt, nickel, indium, tin, antimony, lead, bismuth and mixtures thereof. In a preferred embodiment, the metal powder mixture contains metal powder and/or metal flake and colloidal or semi-colloidal metal powder where the composition contains about 60 to 85% by weight of the metal powder mixture, more preferably about 70 to 80% by weight of the metal powder mixture.

The metal flakes have a major dimension between 2 to 10 micrometers, preferably about 5 micrometers, and a thickness of less than 1 micrometer. They can be produced by techniques well known in the art by milling the corresponding metal powder with a lubricant, which is frequently a fatty acid or fatty acid soap. The starting powders are usually produced by chemical precipitation to obtain the desired particle size and degree of purity.

The metal powders and flakes perform several functions. They form a skeleton structure in the printed image which holds the other ingredients together and prevents loss of resolution when the mixture is heated to cure it. The flakes naturally assume a lamellar structure like a stone wall which provides electrical conductivity in the direction parallel to the surface of the substrate and provides a framework to lessen the amount of metal transport necessary to achieve the well-consolidated pure metal conductors which are the objective of this invention. They also provide low surface energy, flat surfaces to which the other constituents of the composition can bond and on which metal can be deposited.

The other metallic powder mixture constituent of the present invention are colloidal or semi-colloidal powders with diameters below 100 nanometers. The colloidal or semi-colloidal powder is preferably present in about 5 to 50% by weight of the total weight of the metal powder mixture, more preferably about 10% by weight of the total weight of the metal powder mixture. A primary function of these powders is to lower the temperature at which the compositions will consolidate to nearly solid pure metal conductors. The presence of fine metal powder has been found to be helpful in advancing this low temperature process with silver and essential to the consolidation of copper mixtures.

The Reactive Organic Medium (ROM) provides the environment in which the metal powder mixture is bonded together to form well-consolidated conductors. Many classes of organic compounds can function as the ROM. The common characteristic which they share and which renders them effective is that they have, or can form, a bond to the metal via a hetero-atom. The hetero-atoms can be oxygen, nitrogen, sulfur, phosphorous, arsenic, selenium and other nonmetallic elements, preferably oxygen, nitrogen or sulfur. This bond is weaker than the bonds holding the organic moiety together, and can be thermally broken to deposit the metal. In most cases the reaction is reversible, so that the acid or other organic residue can react with metal to reform the metallo-organic compound, as shown schematically below:

where R is a reactive organic compound and M is the metal.

Examples of such compounds are soaps of carboxylic acids, in which the hetero-atom is oxygen; amino compounds, in which the hetero-atom is nitrogen; and mercapto compounds, in which the hetero-atom is sulfur.

Specific examples of preferred ROM constituents are the carboxylic acids and the corresponding metallic soaps of neodecanoic acid and 2-ethyl hexanoic acid with silver and copper, such as silver neodecanoate illustrated by the formula:

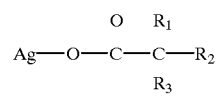

where $R_1$, $R_2$, and $R_3$ together comprise $C_9H_{19}$ and silver 2-ethyl hexanoate as illustrated by the formula:

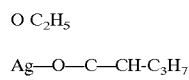

Gold amine 2-ethyl hexanoate is an example of a nitrogen compound:

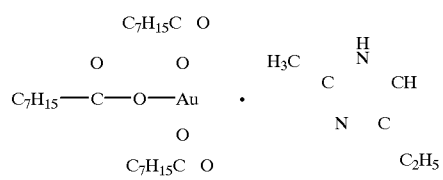

Gold amine 2-ethyl hexanoate (gold amine octoate)

Gold t-dodecyl mercaptide is an example of a sulfur compound:

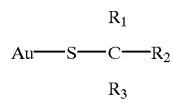

where $R_1$, $R_2$, and $R_3$ together comprise $C_{11}H_{23}$

These ROM compositions can be made by methods well known in the art. All of the above compounds are capable of decomposition to the respective metals at relatively low temperatures. For the silver neodecanoate and silver 2-ethyl hexanoate (silver octoate), the decomposition temperature is between 200 and 250° C. For the corresponding copper compounds, it is between 300 and 315° C. Gold sulfides decompose at very low temperatures in the neighborhood of 150° C. Gold amine octoate decomposes between 300 and 500° C. The copper and silver compounds can be reformed from the corresponding acids at the same temperature, so the reaction is reversible, as mentioned above.

In some cases it is convenient to add rheology-enhancing compounds well known in the art to improve the printing characteristics of the compositions of the invention. Alpha-terpineol has been used to reduce the viscosity of copper and silver compositions to facilitate screen printing. Alpha-terpineol also participates in the consolidation reaction by virtue of the acid character of the OH group bonded to an unsaturated ring. By selecting constituents and additives, it has proven possible to produce a range of printable compositions ranging from fluid inks with a viscosity of 15 centipoise to solid powders.

PARMOD™ compositions have been applied by screening, stenciling, gravure printing, dispensing, ink jet printing and electrographic printing with a liquid toner. Screening, as used in applying conventional thick film pastes, has been used most extensively for preparing samples for evaluation. A composition with a viscosity of approximately 500 poise is forced through a fine screen with a photo-defined open image of the desired conductor pattern in it by a rubber squeegee. The resolution which has been achieved by this method is approximately 125 micron (5 mil) lines and spaces, although production screen printers can achieve patterns as fine as 50 microns. Conductive traces with thicknesses up to 50 microns have been printed, though most of the test patterns have been in the neighborhood of 12 microns thick.

When the metallo-organic decomposition compound or the acid from which it is formed is mixed with the metal flake and colloidal metal powder constituents described above, printed as a relatively thin layer on an appropriate substrate, and heated to a critical temperature above the decomposition temperature of the metallo-organic compound, a reaction takes place which results in the sudden consolidation of the loosely aggregated metal constituents into a nearly solid metal trace with greatly reduced electrical resistivity.

When the traces are heated above the critical temperature, there is a very rapid decrease in electrical resistivity, a dramatic increase in mechanical cohesive strength of the deposit and the appearance of the deposits changes. Copper, silver and gold mixtures have been heated above the critical temperature, and the metal flake and powder has consolidated into a bonded network of solid metal. The resistivity of the traces drops to a value below 1.0 gram ohm/m$^2$ in a time measured in seconds at temperatures low enough to be used on polymer substrates. The bulk resistivity of copper is 0.15 gram ohm/m$^2$.

At the same temperature at which the resistivity drops, the mechanical properties of the traces improve equally dramatically. From being brittle and poorly adherent as measured by creasing the samples and pulling the traces off with Scotch Tape the samples become ductile enough to survive a sharp 180 degree crease in the 75 micron (3 mil) substrate followed by tape testing. The crease test is equivalent to an elongation of the metal trace of 17%. The tape test is equivalent to an adhesion of approximately 10 Newtons/cm (6 lb per lineal inch) Heating to still higher temperatures decreases the resistivity only slightly.

Copper is the material of choice for conductors in electronic circuits. It has excellent electrical conductivity, good mechanical properties, excellent solderability and low cost, abundant supplies. It has the further advantage of many years of successful use and a very large background of experience. Copper based PARMOD™ was applied to unclad polyimide-glass and epoxy-glass, and cured at temperatures below 350° C., preferably about 260–300° C. for 10 minutes in a $N_2$-$H_2O$—$H_2$ atmosphere. In the case of the epoxy-glass, the maximum temperature used was 265° C., and for the polyimide-glass, the maximum temperature used was 300° C. The results are shown in Table 1. The electrical properties of the epoxy-glass samples were very poor, and the circuit did not stick well to the epoxy-glass substrate. The electrical properties of the samples on polyimide-glass were very good and the circuit was bright copper colored, but the sample did not stick well to the substrate.

The use of an adhesive diffusion barrier coating on a substrate has been found to improve the application of PARMOD™ to the substrate. For example, with epoxy-glass substrates, the coating allows copper PARMOD™ samples to be fired at temperatures where epoxy-glass substrates otherwise could not be processed without decomposing the board. Further, the coating provides a barrier to organic volatiles being liberated by the epoxy of the substrate. Finally, the adhesive properties of the coating result in a favorable physical or chemical bond between the PARMOD™ circuit and the substrate, enhancing the adhesion of the PARMOD™ to the substrate.

It has been found beneficial to isolate the organic polymer-based substrate chemically from the decomposing organometallic PARMOD™ mixture; this isolation is provided by the diffusion barrier. Additionally, the use of a diffusion barrier is advantageous for the application of copper PARMOD™ to epoxy-glass substrates because of its isolation/shielding of the apparent chemical interference between the epoxy and the curing process of the copper PARMOD™.

Well-bonded silver PARMOD™ circuits were made on epoxy-glass substrates. The adhesion of such circuits to the substrates is very dependent on the exact source of the epoxy-glass substrate and may also be effected by the age and condition of the substrate. The adhesive diffusion barrier layer of this invention provides a more reliable bond in cases of epoxy-glass substrates with inferior adhesive and chemical properties.

In a preferred embodiment, the adhesive diffusion barrier material is LARC-SI, a soluble polyimide, developed at NASA-Langley. LARC-SI is a polymer of 3,4'-oxydianiline (ODA) and a mixture of 4,4'-oxydiphthallic dianhydride (ODPA) and 3,4,3',4'-biphenyl tetracarboxylic dianhydride (BPDA) which is soluble in n-methyl pyrrolidinone (NMP, 1-methyl-2-pyrrolidinone) solvent. Other adhesive diffusion barrier materials include low $T_g$ polyimides, silicones, fluorocarbons, soluble polyimides, polyimide amides and polyamic acids.

The diffusion and adhesive barrier can be applied to the substrate by any conventional method, including for example, brushing, spraying, roll coating, dipping, doctor blading and curtain coating. Because of the high cost of the polyimide coating material, there is incentive to apply a thin, uniform coating. A preferred method for applying the polyimide coating is spin coating. In spin coating the substrate is spun about an axis perpendicular to the surface. The polyimide is applied to the substrate surface before and/or during the spinning procedure, thereby spreading the polyimide using centrifugal force.

Copper PARMOD™ was applied to both polyimide coated polyimide-glass and epoxy-glass samples. A thin coating of soluble polyimide (LARC-SI) was prepared by mixing the LARC-SI with n-methyl pyrolidinone, and applying the mixture with a brush to the epoxy-glass and polyimide-glass substrates. The LARC-SI was dried in air at low temperature initially (about 120° C.), then at higher temperature (up to 200° C.) to insure that all of the solvent had been removed. The samples were then cured at 260° C.–300° C. for 10 minutes in a $N_2$-$H_2O$—$H_2$ atmosphere.

Table 1 presents comparative data of copper PARMOD™ on a variety of uncoated substrates and the coated substrates of this invention:

TABLE 1

| Substrate | Temp | Time (seconds) | Resistivity ($\mu\Omega$-cm) | Tape Test |
|---|---|---|---|---|
| FR-406 | 246° C. | 360 | 340 | Powdery |
|  | 253° C. | 360 | 355 | Powdery |
|  | 260° C. | 360 | 800 | Powdery |
| FR-406/Larc-Si | 260° C. | 600 | 5 | Slightly Powdery |
|  | 265° C. | 600 | 4.5 | Slightly Powdery |
| P-95 | 252° C. | 360 | 8.9 | Did not adhere |
| P-95/Larc-Si | 252° C. | 600 | 5.2 | Adhered |
|  | 252° C. | 600 | 4.0 | Adhered |
|  | 301° C. | 600 | 10.7 | Adhered |

The results in Table 1 show that:

Epoxy glass interferes with the curing of copper PARMOD™ and results in poorly consolidated, poorly adhered traces.

Providing a polyimide coating on an epoxy-glass substrate eliminates the interference with the PARMOD™ cure and also provides acceptable adhesion of the resulting traces.

PARMOD™ cures properly to well consolidated, low-resistivity metal on polyimide-glass, but adhesion is poor.

Providing a polyimide coating on the polyimide-glass substrate results in well-adhered traces.

The data in Table 1 show that the application of the polyimide dramatically improves the appearance, adhesion, and electrical properties of the resulting circuit on the epoxy-glass, and dramatically improves the adhesion of the circuit on the polyimide-glass. The difference in appearance of the circuits on the epoxy-glass, with and without the soluble polyimide coating is striking, suggesting that the coating may be acting as a barrier to organics resulting from the heating of the epoxy of the substrate.

Good adhesion to polyimide films generally requires the presence of an adhesive coating. FEP Teflon® and low glass transition point polyimide coatings have been found to be satisfactory for adhering PARMOD™ images printed on the coatings and cured as described above. Silver PARMOD™ can be printed and cured on conventional G-10 and FR-4 epoxy glass laminates. The images may adhere to some grades of G-10 without additional adhesive, however in most cases an adhesive coating is required. Both FEP Teflon® and low melting polyimides are preferred coatings for use with silver PARMOD™ compositions.

EXAMPLES

The examples described below indicate how the individual constituents of the preferred compositions and the conditions for applying them function to provide the desired result. The examples will serve to further typify the nature of this invention, but should not be construed as a limitation in the scope thereof, which scope is defined solely in the appended claims.

Example 1

A copper Parmod™ ink was made by mixing 51.5 grams of 3 micron diameter copper powder (Cerac), 31.78 grams of colloidal copper powder, 11.5 grams of neodecanoic acid, and 5.2 grams of α-terpineol. The copper Parmod™ ink was screen printed on unclad 0.0625 inch thick FR-406 epoxy-glass laminate (Allied Signal) and oven cured for six minutes at temperatures ranging from 246° C. to 260° C. The electrical resistivity of the printed traces was very high. The traces did not pass the tape test for adhesion and cohesion of the metal.

Example 2

The procedure of Example 1 was repeated except that the laminate was coated with the soluble polyimide LARC-SI (Langley Research Center—Soluble Imide[NASA]) obtained from Virginia Power Corporation before the copper ink traces were printed on the laminate.

An approximately 0.001 inch thick coating of LARC-SI was applied to the substrate by diluting the resin (LARC-SI) solution with additional NMP to approximately 23% by Weight resin and applying to the substrate with a brush. The resin was dried in air at about 120° C. for 30–60 minutes prior to printing and curing the PARMOD™.

Example 3

The procedure of Example 1 was repeated except that an uncoated, 0.065 inch thick polyimide glass laminate (P-95 by Allied Signal) was used. Copper PARMOD™ traces applied to the uncoated P-95 laminate cured to high conductivity metal and no chemical interference (as seen with the epoxy substrate) was observed. The resulting traces did not adhere to the uncoated polyimide substrate.

Example 4

The procedure of Example 3 was repeated except that an LARC-SI coated, 0.065 inch thick polyimide glass laminate (P-95 by Allied Signal) was used. Copper PARMOD™ traces applied to the LARC-SI coated P-95 laminate showed acceptable resistivity and the tape test was clean—showing that the traces were well adhered to the substrate.

Example 5

The procedure of Example 4 was repeated/followed except that the polyimide coating used was Probimide 30A polyamide-imide (Arch Chemical Co.) The Probimide 30A was thinned to approximately 1 centipoise with NMP and applied with an airbrush to achieve a thin uniform coating on the P-95 laminate. The coatings were dried for no more than 90 minutes in air at about 110o° C. to remove solvent after which they were stored in a dessicator to eliminate the well-known pick up of atmospheric moisture by polyamidides. Copper PARMOD™ ink printed and cured on the Probimide-coated P-95 laminate exhibited excellent adhesion, particularly in Probimide-coated through holes from one side of the laminate to the other.

Example 6

A 10% by weight solution of LARC-SI in NMP was applied to G-10 epoxy glass laminate by brushing to wet the entire surface. The substrates were then spun at approximately 300 rpm producing a thin uniform coating of polyimide. Several hundred sample circuits were successfully printed on these substrates with copper PARMOD™.

Example 7

A silver PARMOD™ composition was prepared by mixing together the following components:

| silver flake | 1.2 g |
| silver neodecanoate | 0.30 g |
| α-terpineol | 0.18 g |
| neodecanoic acid | 2 drops |

The mixture was then milled on a 2-roll mill for 30 minutes.

Example 8

A silver PARMOD™ composition was prepared by mixing together the following components:

| silver flake | 1.2 g |
| silver neodecanoate | 0.30 g |
| neodecanoic acid | 0.16 g |

The mixture was then milled on a 2-roll mill for 30 minutes.

Example 9

Silver PARMOD™ composition of Example 8 was screen printed onto a Garolite G10/FR-4 laminate substrate. The sample was placed in a box furnace with an air atmosphere and heated to 225° C. over a period of 5 minutes. The resulting silver film had a resistance of 2.3Ω per a 23.7 cm long×0.396 mm wide trace. A tape test of the silver trace was good. This substrate did not interfere with the conversion of the ink to a metal foil and good adhesion of the metal foil to the substrate was obtained.

Example 10

Silver PARMOD™ composition of Example 7 was screen printed onto a 0.031 inch thick FR-406 laminate substrate (Allied Signal). The sample was placed in a box furnace with an air atmosphere and heated to 250° C. over a period of 6 minutes. The resulting silver film had a resistance of 4.7Ω per a 23.7 cm long×0.396 mm wide trace, which corresponds to a resistivity of about 12.0 $\mu\Omega$-cm. A tape test of the silver trace was poor. The silver had not "cured" into a continuous metal foil. The bottom of the trace was adhered to the substrate, but since the silver had not formed a continuous foil, the top layer of "improperly cured" silver was removed by the tape. The substrate appears to have interfered with the transformation of the silver ink into a continuous metal foil.

Example 11

Silver PARMOD™ composition of Example 8 was screen printed onto a Precision Laminates 0.004" FR-4 inner layer laminate substrate. The sample was placed in a box furnace with an air atmosphere and heated to 225° C. over a period of 5 minutes. The resulting silver film had a resistance of 3.0Ω per a 23.7 cm long×0.396 mm wide trace. A tape test of the silver trace was poor and the results were similar to Example 10.

Example 12

Silver PARMOD™ composition of Example 8 was screen printed onto an Allied Signal 0.004 inch thick FR-4 inner layer laminate substrate. The sample was placed in a box furnace with an air atmosphere and heated to 225° C. over a period of 5 minutes. The resulting silver film had a resistance of 2.9Ω per a 23.7 cm long×0.396 mm wide trace. A tape test of the silver trace was poor and the results were similar to Example 10.

Example 13

Silver PARMOD™ composition of Example 8 was screen printed onto an Allied Signal FR-406 laminate substrate. The sample was placed in a box furnace with an air atmosphere and heated to 225° C. over a period of 5 minutes. The resulting silver film had a resistance of 4.3Ω per a 23.7 cm long×0.396 mm wide trace. A tape test of the silver trace was poor and the results were similar to Example 10.

Example 14

Silver PARMOD™ composition of Example 8 was screen printed onto a Garolite G11 high temperature epoxy-glass laminate substrate. The sample was placed in a box furnace with an air atmosphere and heated to 250° C. over a period of 5 minutes. The resulting silver film had a resistance of 1.9Ω per a 23.7 cm long×0.396 mm wide trace, which corresponds to a resistivity of about 4.5 $\mu\Omega$-cm. A tape test of the silver trace was poor. However, unlike the previous examples, the silver had converted into a continuous metal foil and was completely removed from the substrate. This substrate did not interfere with the curing process of the ink, but also did not provide good adhesion with the resulting metal foil.

Example 15

Silver PARMOD™ composition of Example 8 was screen printed onto a Kapton FN polyimide substrate which is coated with FEP Teflon. The sample was placed in a box furnace with an air atmosphere and heated to 260° C. over a period of 5 minutes. The resulting silver film had a resistance of 1.5Ω per a 23.7 cm long×0.396 mm wide trace, which corresponds to a resistivity of about 3.8 $\mu\Omega$-cm. A tape test of the silver trace was good. This substrate did not interfere with the conversion of the ink to a metal foil and good adhesion of the metal foil to the substrate was obtained.

Example 16

Silver PARMOD™ composition of Example 8 was screen printed onto a Kapton EKJ polyimide substrate which is coated with a low melting polyimide. The sample was placed in a box furnace with an air atmosphere and heated to 260° C. over a period of 4 minutes. The resulting silver film had a resistance of 1.3Ω per a 23.7 cm long×0.396 mm wide trace, which corresponds to a resistivity of about 3.2 $\mu\Omega$-cm. A tape test of the silver trace was good. This substrate did not interfere with the conversion of the ink to a metal foil and good adhesion of the metal foil to the substrate was obtained.

What is claimed:

1. A method for producing solid pure metal conductors on a substrate comprising the steps of:
    A) applying a conductor precursor in the desired pattern on to the substrate, said substrate having a coating layer of a diffusion and adhesive barrier whereby the coating layer of a diffusion and adhesive barrier is selected from the group consisting of low $T_g$ polyimides, silicones, fluorocarbons, soluble polyimides, polyimide amides, polyamic acids, or combinations thereof;
    B) heating the substrate in an oven to a critical temperature less than about 450° C. for a time less than about ten minutes;

wherein said applied conductor precursor pattern is converted into a well-consolidated, well-bonded pure metal conductor wherein said conductor precursor is comprised of a reactive organic medium a metal powder mixture.

2. The method of claim 1 wherein said soluble polyimide is comprised of a polymer of 3,4'-oxydianiline and a mixture of 4,4'-oxydiphthallic dianhydride and 3,4,3',4'-biphenyl tetracarboxylic dianhydride.

3. The method of claim 1 wherein said diffusion and adhesive barrier is comprised of FEP polytetrafluoroethylene.

4. The method of claim 1 wherein said diffusion and adhesive barrier applied to the substrate by brushing, spraying, roll coating, dipping, doctor blading, spin coating, curtain coating or laminating.

5. The method of claim 1 in which said conductor precursor is applied to said substrate by a technology selected from the group consisting of:

screen printing, stencil printing, gravure printing, impression printing, offset printing, lithographic printing, dispensing, doctor blading, ink jet printing, xerographic copying and electrostatic printing.

6. The method of claim 1 in which said conductor precursor is a copper-based composition and in which the oven atmosphere is nitrogen with less than 100 parts per million by volume of oxygen preferably less than 20 parts per million.

7. The method of claim 6 in which water vapor is added to the nitrogen to the extent of approximately 5 mole percent during the period in which said conductor precursor is being heated but not before or after the heating phase.

8. The method of claim 1 in which the substrate contains a polymer which is sensitive to temperatures above about 450° C.

9. The method of claim 1 in which the substrate contains a semiconductor which is sensitive to temperatures above about 450° C.

10. The method of claim 1 in which said conductor precursor is applied to metal conductors and dielectric insulators to make electrical connections between the conductors.

11. The method of claim 1 in which said conductor precursor are applied in step A) to a continuous web of thin substrate material and cured in step B) as a continuous web in an oven, further comprising the step of:

C) cutting said continuous web of thin substrate material into a final product.

* * * * *

UNITED STATES PATENT AND TRADEMARK OFFICE
CERTIFICATE OF CORRECTION

PATENT NO. : 6,143,356
DATED : November 7, 2000
INVENTOR(S) : Gregory A. Jablonski It is certified that error appears in the above-identified patent and that said Letters Patent is hereby corrected as shown below:

Column 11,
Line 5, after the word "medium" insert the word -- and --.

Signed and Sealed this

Twenty-eighth Day of May, 2002

Attest:

JAMES E. ROGAN
Attesting Officer  Director of the United States Patent and Trademark Office